Figure 1:
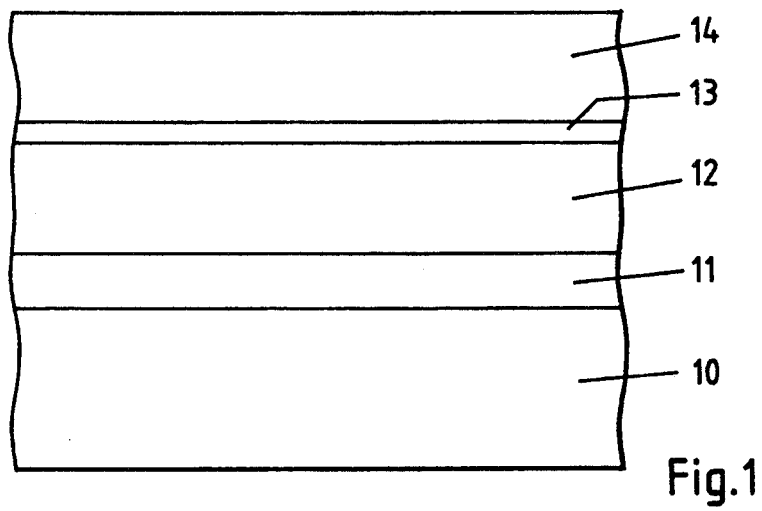

United States Patent [19]

Evetts et al.

[11] Patent Number: 5,361,720
[45] Date of Patent: Nov. 8, 1994

[54] EPITAXIAL DEPOSITION

[75] Inventors: Jan E. Evetts; Robert E. Somekh, both of Cambridge, England

[73] Assignee: British Technology Group Ltd., London, England

[21] Appl. No.: 996,510

[22] Filed: Dec. 11, 1992

Related U.S. Application Data

[60] Continuation of Ser. No. 726,797, Jul. 8, 1991, abandoned, which is a division of Ser. No. 576,506, Oct. 2, 1990, abandoned.

[30] Foreign Application Priority Data

Apr. 22, 1988 [GB] United Kingdom ................. 8809548

[51] Int. Cl.$^5$ .......................................... C30B 25/06
[52] U.S. Cl. ................................. 505/329; 117/994; 117/91; 505/729; 505/475; 204/192.22; 204/192.24
[58] Field of Search ....................... 156/610, DIG. 78; 505/1, 729; 204/194.22, 194.24

[56] References Cited

U.S. PATENT DOCUMENTS

| | | | |
|---|---|---|---|
| 4,921,833 | 5/1990 | Takano | 204/192.24 |
| 5,059,585 | 10/1991 | Sugihara et al. | 204/192.24 |
| 5,077,270 | 12/1991 | Takeda et al. | 204/192.15 |
| 5,084,265 | 1/1992 | Harada et al. | 423/592 |

FOREIGN PATENT DOCUMENTS 0292959 11/1988 European Pat. Off. .
0304078 2/1989 European Pat. Off. .

OTHER PUBLICATIONS

Kuriki et al, "Sputter Deposition and Annealing of Y–Ba–Cu–O Famson Different Substrates," Extend Abs of 1987 International Superconductivity Electronics Conf. (ISEC) 1987.
Commission of the European Communities, Eur. Workshop on High Tc Superconductors and Potential Applns., 1-3 Jul. 1987, Genova, (IT), M.G. Blamire et al, pp. 129–130, see p. 129, paragraphs 1–1.
Patent Abstracts of Japan, vol. 11, No. 390 (E–567) (2837), 19 Dec. 1987, & JP. A. 62154676 (Toyo Soda Mfg. Co. Ltd.) 9 Jul. 1987 see the whole abstract.
Japanese Journal of Applied Physics, part 2 : Letters, vol. 27, No. 3, Mar. 1988, H. Koinuma et al. pp. L376–L377, see p. L376, left-hand column, paragraph 2—right-hand column, paragraph 1.
A.I.P. Conf. Proc., No. 165, 1988, Topical Conf. on Thin Film Processing & Characterization of High Tc Super-cond., 6 Nov. 1987, Anaheim, Calif., American Institute of Physics, (US), D. Burbidge et al, see p. 88.
IBM Technical Disclosure Bulletin, vol. 27, No. 3, Aug. 1984, (New York, US) W. Anacker pp. 1529–1531 see p. 1529, paragraph 1.
Patent Abstracts of Japan, vol. 11, No. 271 (E–536) (2718), 3 Sep. 1987, & JP, A, 6272187 (Toyo Soda Mfg. Co, Ltd.) 2 Apr. 1987 see the whole abstract.
Patent Abstracts of Japan, vol. 11, No. 187 (E–516) (2634), 16 Jun. 1987, & JP, A 6215869 (Nippon Telegr. & Teleph Corp.) 24 Jan. 1987 see the whole abstract.

*Primary Examiner*—Robert Kunemund
*Attorney, Agent, or Firm*—Cushman, Darby & Cushman

[57] ABSTRACT

A method of manufacture of thin film devices involves the sputtering of an epitaxial barrier layer (11) of a metallic oxide such as magnesia on to which a further epitaxial thin film (12) is deposited. The substrate is preferably alumina and the thin film may be a high temperature superconductive compound of yttrium, barium, copper and oxygen.

9 Claims, 4 Drawing Sheets

EPITAXIAL DEPOSITION

This is a continuation of patent application Ser. No. 07/726,797, filed on Jul. 8, 1991, which was abandoned upon the filing hereof which is a divisional of Ser. No. 07/576,506, filed on Oct. 2, 1990 now abandoned.

This invention relates to the formation of high quality single crystal or near single crystal epitaxial barrier layers and, in particular, to the formation of such layers either as a preliminary to, or at an intermediate stage of, the fabrication of multilayer thin film structures for application in solid state devices or circuits. Such layers formed epitaxially on a single crystal substrate may act either as a chemical barrier to prevent the migration of impurities or as an electrical barrier to control or eliminate the passage of electric current.

Thin film devices and microelectronic circuits are frequently formed by growing perfect single crystal or near single crystal layers on substrate wafers that are themselves single crystal. The films are said to be epitaxial when their crystal orientation is determined during growth by matching to the lattice periodicity of the substrate. Furthermore when a multilayer thin film is formed epitaxy may sometimes be maintained by matching each layer to some lattice periodicity in the preceding layer. High quality epitaxial layers are required either for their electrical or magnetic properties or alternatively as insulating or dielectric layers or as barrier layers to prevent chemical interdiffusion and degradation of layers by separating them physically.

Sometimes the application envisaged does not require single crystal epitaxy as far as the actual performance of a particular layer itself is concerned. However, epitaxy may still be necessary so as to transfer epitaxial growth to a layer to be subsequently deposited which does require epitaxy for it to function correctly in the application envisaged.

According to one aspect of the invention there is provided a method of manufacture of solid state devices comprising the formation of an epitaxial layer of magnesia by sputtering of material from a magnesium-containing target on to an alumina-containing substrate and the subsequent formation of an epitaxial layer of a compound including yttrium, barium, copper and oxygen on said layer of magnesia.

There is also provided a solid state device comprising a first epitaxial layer of a material selected from the class including superconductors and semiconductors formed on a second epitaxial layer including a metallic oxide on a crystalline substrate.

One embodiment of the present invention provides a method to form an epitaxial barrier layer of magnesia (MgO) on a substrate wafer of sapphire ($Al_2O_3$).

Another embodiment of the invention provides a method of introducing very thin layers of epitaxial magnesia between two layers of high temperature ceramic superconductor having structures related to the perovskite structure.

The invention also contemplates a method of introducing single monolayers of magnesium atoms within a thin film single crystal of high temperature ceramic superconductor with a structure related to the perovskite structure.

In a specific embodiment a single crystal sapphire substrate was coated with an epitaxial barrier layer of magnesia (MgO) by vapour deposition onto the heated substrate. The preferred temperature for the substrate during deposition is 750°–900° C., although it may be as low as 540° C. The crystallographic orientation of the MgO barrier layer depends on the crystallographic orientation of the plane of the $Al_2O_3$ substrate wafer. In particular MgO can be formed with a (100) plane matching epitaxially to r-plane ($10\bar{1}2$) sapphire, or with a (110) plane matching epitaxially to m-plane ($01\bar{1}0$) sapphire, or with a (111) plane matching epitaxially to a-plane ($11\bar{2}0$) or c-plane (0001) sapphire Although this invention has general application in thin film device technology one particular application of importance is in superconducting device technology based on high temperature ceramic superconductors having structures related to the perovskite structure.

In the preferred embodiment of the invention an MgO layer is formed by DC magnetron sputter deposition from a magnesium metal target in a sputtering gas composed of 40% oxygen in argon at a pressure of 1–2 pascals. The preferred deposition rate is 0.05 nanometers per second.

In a second embodiment of the invention an MgO layer is formed by RF sputter deposition from a magnesium metal target or from an MgO oxide target.

In a third embodiment of the invention an MgO layer is deposited by ion beam sputtering from a magnesium metal target or from an MgO oxide target.

In a fourth embodiment of the invention an MgO layer is deposited by laser evaporation from an MgO target.

In a fifth embodiment of the invention an MgO layer is deposited by thermal evaporation or molecular beam evaporation (MBE) of magnesium metal in an oxidising atmosphere.

In a sixth embodiment of the invention an MgO layer is deposited by chemical vapour deposition (CVD) or metal-organic chemical vapour deposition (MOCVD) from suitable chemical precursors.

The MgO epitaxial layer may form a substrate for a further layer of deposited material that derives its epitaxy from the MgO layer. In particular this layer may be an epitaxial layer of high temperature ceramic superconductor with a structure related to the perovskite structure. The barrier layer prevents interdiffusion of aluminium into the superconductor and consequent degradation of superconducting properties.

The invention allows an epitaxial barrier layer or layers to be provided which separate epitaxial layers of high temperature ceramic superconducting material, with structures related to the perovskite structure.

In a preferred embodiment of the invention the barrier layer consists of a single monolayer of magnesium incorporated epitaxially into the perovskite lattice on oxygen vacancies in the structure or on other suitable crystallographic sites in the lattice. The necessary overall properties may be achieved by inserting an appropriate number of monolayer barriers closely spaced in the epitaxial structure. The monolayer barriers shall be on planes parallel to the (001) plane of the perovskite structure.

In a second embodiment of the invention the barrier layer may be an epitaxial layer of MgO deposited on a base electrode of high temperature superconducting ceramic with a structure related to the perovskite structure. When an appropriate thickness of MgO has been deposited an epitaxial counter electrode ceramic superconductor can be deposited.

The invention will now be desired by way of example with reference to the accompanying drawings in which:

FIG. 1 shows a cross-section of a multilayer film on a sapphire substrate.

Figure 6:
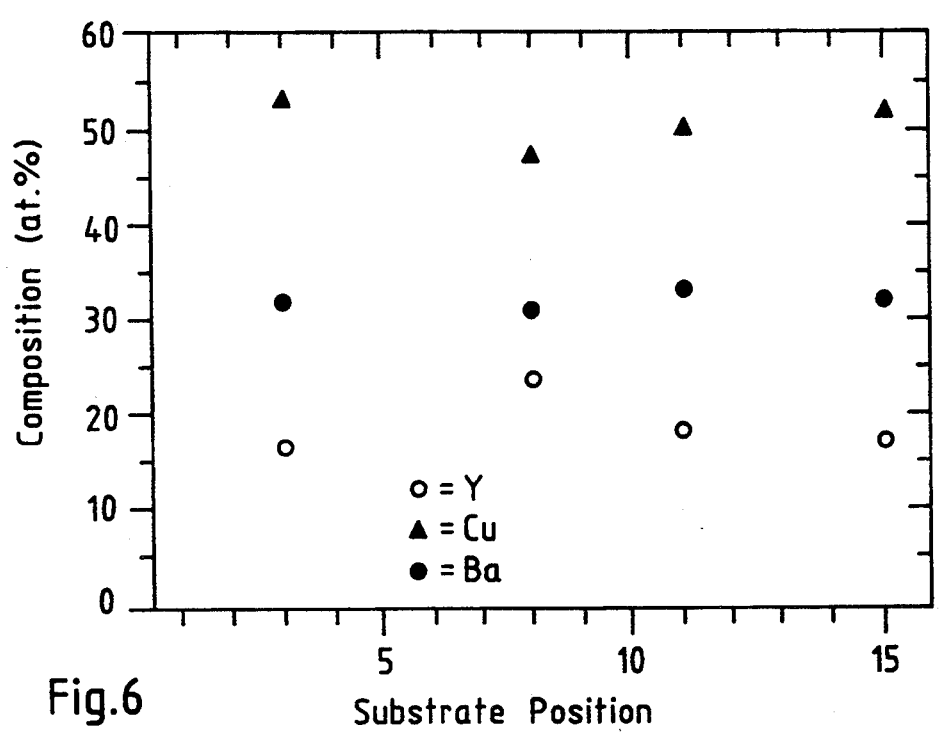
Figure 7A:
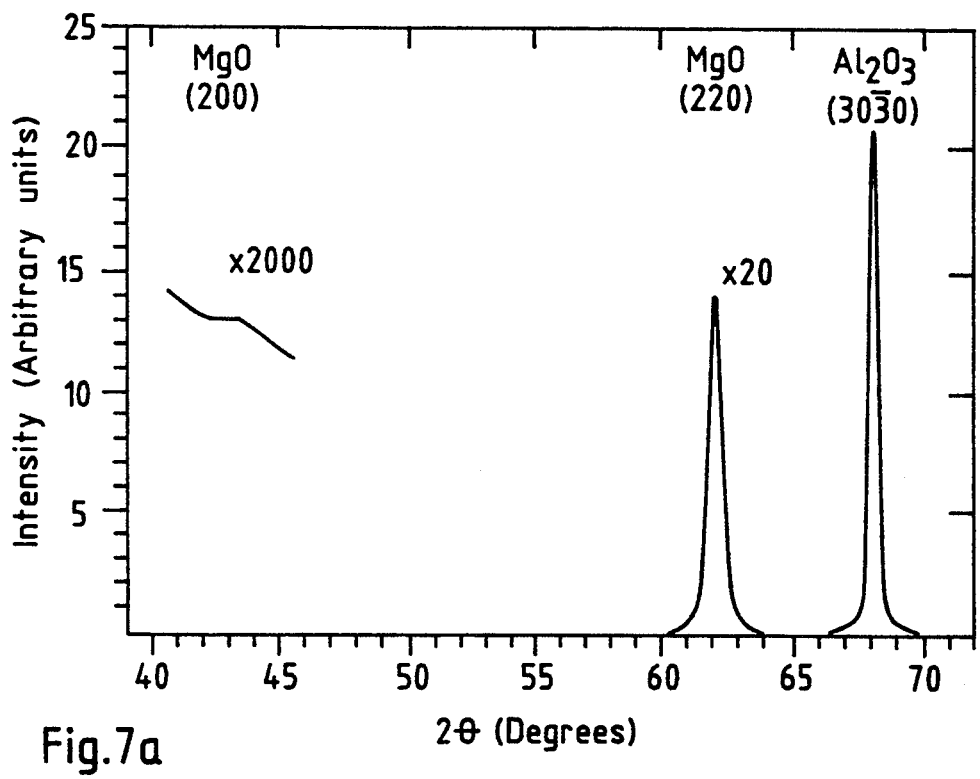
Figure 7B:
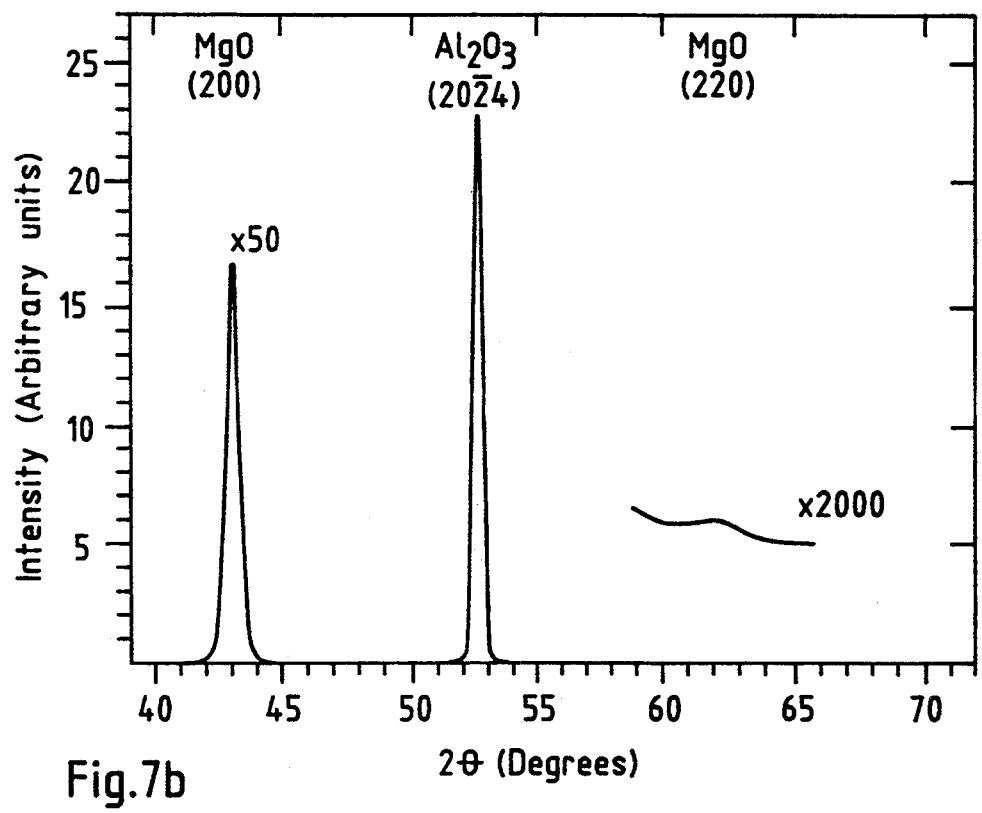

FIGS. 2-6 show the variation of deposited film compositions as various parameters are varied; and FIGS. 7a and 7b are x-ray diffraction patterns showing epitaxial relationships of MgO films on sapphire substrates Referring now to FIG. 1 of the drawings, a sapphire wafer 10 is 0.6 mm thick with r-plane ($10\bar{1}2$) orientation. A buffer layer (11) of magnesia 100 nanometers thick is deposited epitaxially. The single crystal magnesia layer forms a substrate for an epitaxial layer (12) of $Y_1Ba_2Cu_3O_7$ of thickness 200 nanometers orientated with the (001) plane parallel to the substrate. Two single monolayers of magnesium (13) are deposited separated by 0.8 nm. Finally a counterelectrode 14 of (001) orientation $Y_1Ba_2Cu_3O_7$ is deposited to a thickness of 200 nanometers.

Although the illustration relates to a superconducting device, the invention is not limited to this and other applications involving epitaxial barrier layers of MgO on sapphire are envisaged.

For example, in the embodiment of FIG. 1, there are two monolayers of magnesium separated by 0.8 nm. However, it is possible to tailor the precise structure to the requirements of device fabrication. By using a separate source for magnesium and injecting a flux of magnesium as the superconductor is being deposited, sufficient magnesium to form a monolayer of MgO is deposited. It is not even necessary to stop the deposition of superconductor while this takes place. The superconductor deposition is allowed to continue, to deposit one unit cell, or so, and then more magnesium is injected. The objective is to depress the superconductive properties over a barrier region.

With superconductive devices the objective is to have a base electrode of superconductor and then a non-superconducting, preferably insulating, barrier followed by another superconducting layer all being epitaxially structured with relation to one another. It is not possible to structure the thickness of a layer of magnesia optimally, but, by using a sequence of magnesium monolayers separated by a controlled thickness of superconductor, desired properties may be achieved.

Other materials may be used for the barrier layer. In particular, the use of zirconia or strontium titanate is possible.

We have formed films in an ultra-high vacuum dc magnetron sputter deposition system using the method described by R. E. Somekh and Z. H. Barber "UHV sputter deposition with a research scale dc magnetron" J. Physics E 21. This is usable for both pure metal composite targets and sintered ceramic targets.

A metal target, measuring 35 mm by 55 mm, consisted of a surround of copper with yttrium and barium at the two ends of the racetrack in proportions roughly 1:2 divided by a 3-5 mm strip of copper. It was operated at a target-substrate distance of 70 mm and a sputtering pressure of 2-3 Pa. Oxygen was injected into the system close to the substrates using a showerhead arrangement to reduce oxidation of the target.

In a second embodiment, a ceramic target was used. To minimise the composition variation between target and film caused by sputtering due to negative oxygen ions, an operating pressure in the region 15 to 40 Pa was chosen, with a target distance of 20-30 mm. The composition of the ceramic target was adjusted to give the correct film composition at this high sputtering pressure. Several iterations were required, with tiles of composition (1:2:3); (1:3.3:4.2); (1:2.5:4.8); and finally (1:3.9:6.1) being fabricated. The targets were made by carefully calcining a well mixed powder of $BaCO_3$, $Y_2O_3$ and CuO at 890° C. for 72 hours then hydrostatically compacting the reground powder at a pressure of 16 MPa to form three tiles. After compaction these were fired at 900° C. for 36-56 hours. To prevent the tiles cracking due to differential heating during sputtering, the operating power was reduced to 16 W.

The substrates were placed on a platinum strip heater, the substrate of which was measured with an optical pyrometer. As the substrates were well coated, their temperature could also be measured directly with only small interference of the transmitted radiation from the heater beneath. Measurements indicated that the substrates were cooler than the heater by about 160°-200° C. with the heater at 900° C. Following deposition, the YBaCuO films were heat treated in situ, cooling from 600° C. to 350° C. over a period of an hour in 100 mbar of oxygen.

The sputtering parameters of pressure, temperature and oxygen concentration were measured using energy-dispersive x-ray analysis with a flat piece of sintered $YBa_2Cu_3O_7$ made up from high purity powders as internal standard.

MgO was deposited on to sapphire substrates at a temperature of 850°-900° C. from a pure magnesium target in an argon/15% oxygen mixture. The target ran in oxide mode and there was some interaction between the oxidation level of the metal and the radiation from the heater and power loading of the magnetron. It was found that the target oxidation was accelerated if the power loading was too large, and hence a power level of only .25 W was used to give consistent deposition.

Figure 2:
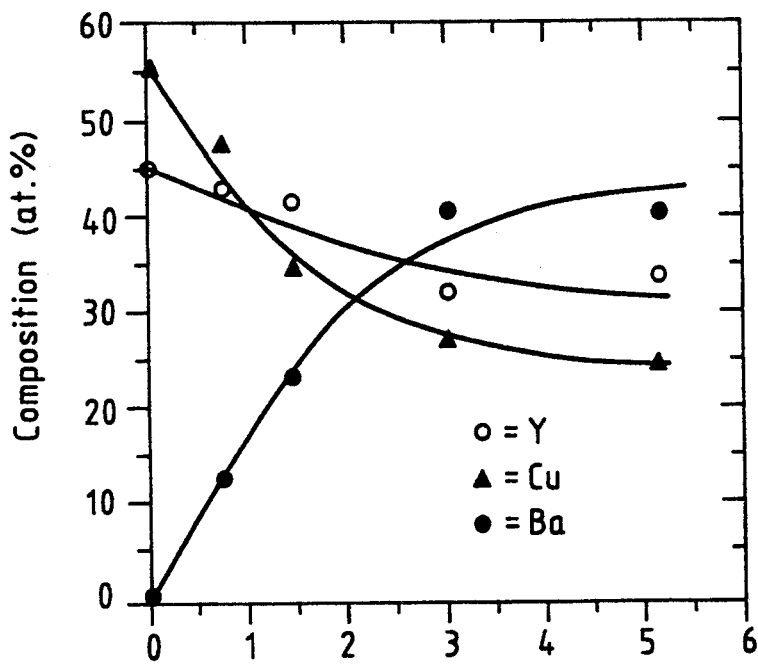

The effect of varying the oxygen concentration in the sputtering gas with a metal target is shown in FIG. 2. This indicates the necessity of oxygen for the 'sticking' of barium at elevated temperatures, where the native barium has a tendency to reevaporate unless it is incorporated into the structure.

Figure 3:
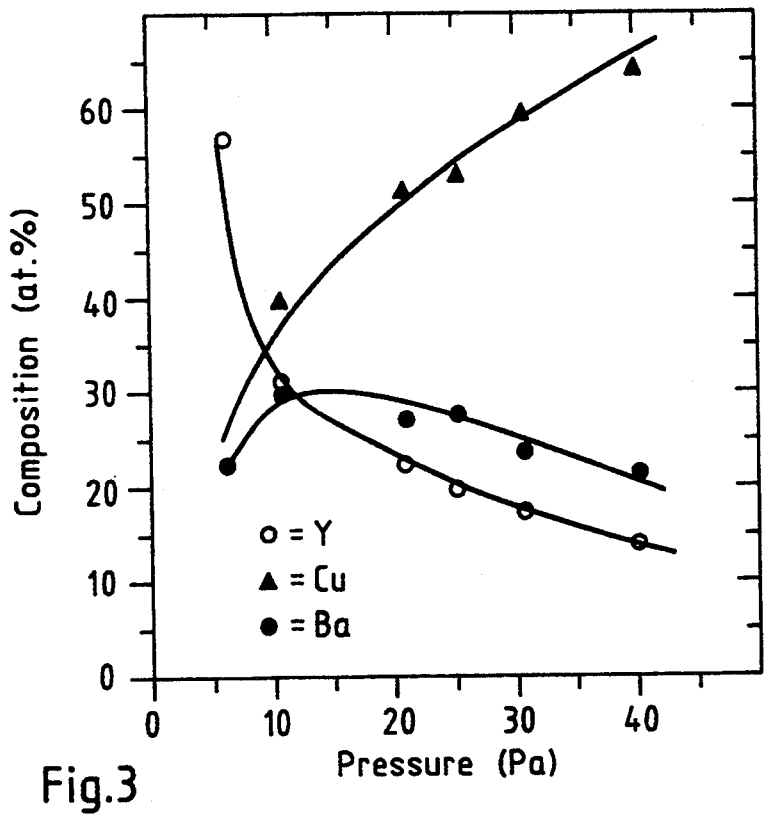
Figure 4:
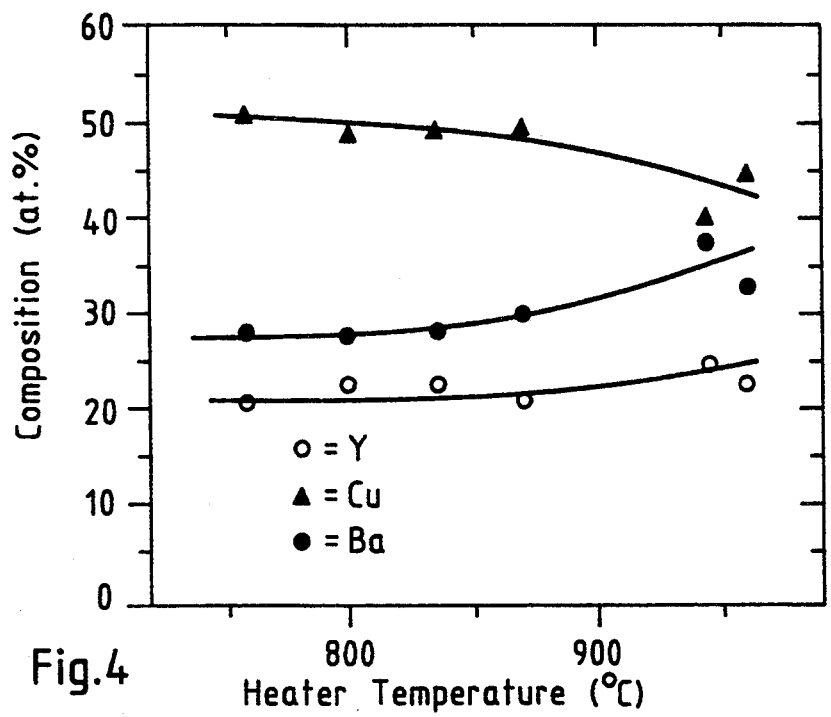
Figure 5:
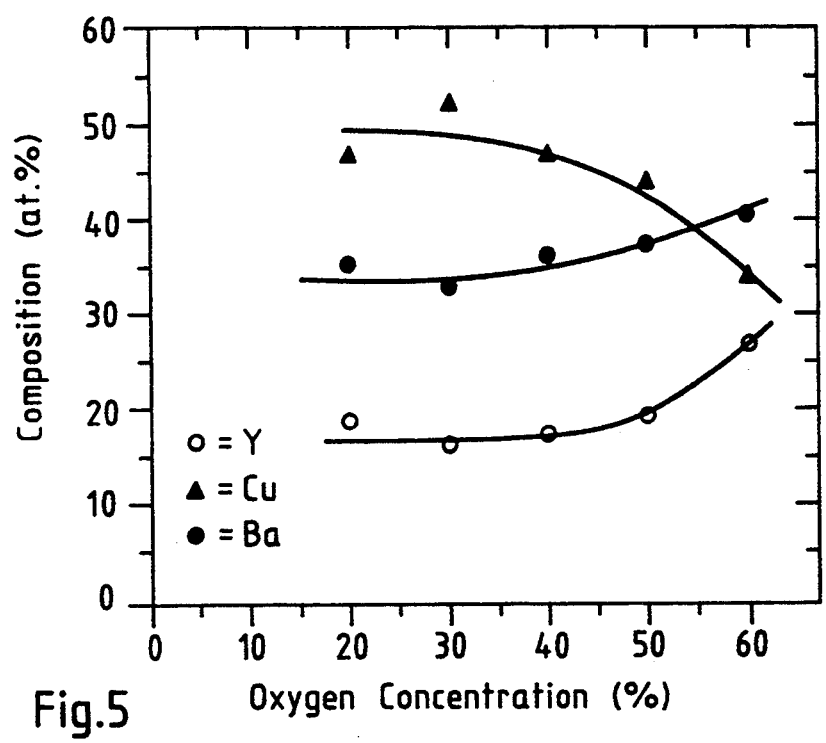

The effects of changing deposition parameters on film composition are shown in FIGS. 3 to 5. These illustrate the degree of preferential resputtering occurring in this system and indicate the required degree of control for a specified tolerance in film composition. At low pressures resputtering due to energetic oxygen anions is enhanced, with copper and barium being preferentially removed. At high temperatures, the copper shows a tendency to reevaporate.

When operating the system at such small working distances, it was found that there was some compositional variation along the heater, as shown in FIG. 6. This effect could be reduced by altering the compositions of the end tiles.

The major effect of this work has been aimed at making the YBaCuO directly on to an epitaxial MgO film on $Al_2O_3$. In an original embodiment the MgO was deposited on to sapphire substrates which were transferred to another system in which the YBaCuO was deposited, but a later embodiment has combined the two deposition steps so that the YBaCuO could be deposited directly without breaking the vacuum.

We have deposited MgO epitaxially on to four different orientations of sapphire. (111) MgO grew on both a-plane ($11\bar{2}0$) and c-plane (0001), whilst (110) MgO grew on m-plane ($10\bar{1}0$) and (100) MgO grew on r-plane sapphire. FIGS. 7a and 7b show x-ray diffraction patterns from a vertical diffractometer. These illustrate there is a mosaic spread of ±0.2% for both epitaxial lines. In addition, the (111) MgO peak was present in both traces, with an intensity of between 0.5% and 1% of the epitaxial lines. Although this represents less than perfect epitaxy, improvements can be achieved with further optimisation of the deposition conditions.

Although most of our x-ray analysis has been performed with a vertical diffractometer which necessitated the tilting of the sample with respect to the incident beam to maximise the peak intensity, we have recently decoupled $\Theta$ and $2\Theta$ using a two-circle diffractometer. This has shown that the (110) MgO pole is inclined by about 0.8° from the m-plane substrate and the (100) MgO pole is inclined by about 5.5° (±0.5°) from the r-plane, on the zone linking ($10\bar{1}2$) and (0001). This indicates a systematic correlation between the MgO and sapphire lattices, although there is a discrepancy of between 3° and 5° with this alignment.

As an illustration of the effect of the barrier layer on $T_c$; a film on an epitaxial MgO layer on sapphire had a zero resistance temperature of 50° K. whilst a film deposited on sapphire directly had a broader transition down to 10° K. A film deposited on to YSZ showed a zero resistance temperature of 75° K. When the thickness of MgO was varied from 80 to 320 nm, it was found that the YBaCuO films deposited on to the thicker MgO could be heated in flowing oxygen at 850° C. for more than an hour without any degradation in their resistivities.

We have found that ideally, to achieve 0.1% compositional accuracy when growing thin films of $YBa_2Cu_3O_7$ on to hot substrates, the temperature should be controlled to ±2.5° C., the sputtering pressure to ±0.5% and the oxygen concentration to within 1%.

For the fabrication of electronic devices such as planar tunnel junctions from epitaxial YBaCuO films, the (110) face is to be preferred, as all atomic sites are exposed at one time, rather than needing many growth ledges to accommodate atoms as they arrive. Furthermore, the tendency to form an extra CuO plane stacking fault and the $Y_2Ba_4Cu_8O_x$ phase is obviated.

By nucleating the correct epitaxy relationship at high temperature, the deposition temperature could be reduced, whilst still preserving the preferred growth orientation.

In a further embodiment of the method, we have replaced oxygen with nitrous oxide in the sputtering process because its lower activation energy increases the density of activated species.

Shapes other than a flat substrate may be used as a basis for the deposition. For example, ribbons are one possibility.

We claim:

1. A method of manufacture of solid state devices characterised in that it consists essentially of the formation of an epitaxial layer of magnesia by sputtering of material from a magnesium-containing target on to an alumina-containing substrate and the subsequent formation of an epitaxial layer of a compound including yttrium, barium, copper and oxygen on said layer of magnesia.

2. A method of manufacture of solid state devices as claimed in claim 1 characterised in that said substrate is heated to a temperature of between 750° C. and 900° C. whilst the material is sputtered from said magnesium containing target.

3. A method of manufacture of solid state devices as claimed in claim 2 characterised in that an oxidising ambient atmosphere is maintained whilst the material is sputtered from said magnesium containing target.

4. A method of manufacture of solid state devices as claimed in claim 3 characterised in that the oxidising ambient atmosphere includes oxygen.

5. A method of manufacture of solid state devices as claimed in claim 3 characterised in that the oxidising ambient atmosphere includes nitrous oxide.

6. A method of manufacture of solid state devices as claimed in either claim 4 or claim 5 characterised in that the oxidising ambient atmosphere includes argon.

7. A method of forming a barrier layer in a solid state device characterised in that it comprises depositing an epitaxial layer of a superconductor material on a substrate, depositing a monolayer of a second material including a metal and oxygen on said epitaxial layer and depositing a further epitaxial layer of said superconductor material on said monolayer.

8. A method of forming a barrier layer in a solid state device as claimed in claim 7 characterised in that said monolayer is deposited simultaneously with said further epitaxial layer.

9. A method of forming a barrier layer in a solid state device as claimed in either claim 7 or claim 8 characterised in that a plurality of monolayers of said second material and corresponding further epitaxial layers of said superconductor material are successively deposited on said substrate.

* * * * *